United States Patent
Ritz et al.

(10) Patent No.: US 9,431,936 B2
(45) Date of Patent: Aug. 30, 2016

(54) METHOD FOR DIAGNOSING A FREQUENCY CONVERTER

(71) Applicant: DR. JOHANNES HEIDENHAIN GmbH, Traunreut (DE)

(72) Inventors: Franz Ritz, Uebersee (DE); Norbert Huber, Teisendorf (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 4 days.

(21) Appl. No.: 14/596,258

(22) Filed: Jan. 14, 2015

(65) Prior Publication Data

US 2015/0214873 A1    Jul. 30, 2015

(30) Foreign Application Priority Data

Jan. 28, 2014  (DE) .................. 10 2014 201 500

(51) Int. Cl.

| | |
|---|---|
| *H02P 6/06* | (2006.01) |
| *H02P 6/12* | (2006.01) |
| *G01R 31/42* | (2006.01) |
| *H02M 1/32* | (2007.01) |
| *H02M 7/5387* | (2007.01) |
| *B60L 3/00* | (2006.01) |
| *G01R 19/165* | (2006.01) |
| *H02M 7/48* | (2007.01) |

(52) U.S. Cl.
CPC .................. *H02P 6/12* (2013.01); *G01R 31/42* (2013.01); *H02M 1/32* (2013.01); *H02M 7/5387* (2013.01); *B60L 3/003* (2013.01); *G01R 19/16547* (2013.01); *H02M 7/48* (2013.01)

(58) Field of Classification Search
CPC ............ H02P 6/182; H02P 6/06; H02P 6/16; H02P 6/08; H02P 6/14
USPC ....................................................... 318/400.06
See application file for complete search history.

(56) References Cited

U.S. PATENT DOCUMENTS

| | | | | |
|---|---|---|---|---|
| 6,160,414 A | * | 12/2000 | Matsubara | G01R 31/346 324/537 |
| 6,747,458 B2 | | 6/2004 | Huber et al. | |
| 6,825,647 B2 | * | 11/2004 | Kranitzky | G01R 31/42 324/85 |
| 2005/0269982 A1 | * | 12/2005 | Coles | H02P 6/185 318/400.05 |
| 2014/0001985 A1 | | 1/2014 | Zhang et al. | |

FOREIGN PATENT DOCUMENTS

| | | |
|---|---|---|
| DE | 10148740 B4 | 4/2003 |
| DE | 102013212096 A1 | 1/2014 |
| EP | 0848492 A1 | 6/1998 |
| EP | 1355163 A2 | 10/2003 |
| JP | 06261404 A | 9/1994 |

* cited by examiner

*Primary Examiner* — Kawing Chan
*Assistant Examiner* — Bradley Brown
(74) *Attorney, Agent, or Firm* — Leydig, Voit & Mayer, Ltd.

(57) ABSTRACT

A method for diagnosing a frequency converter is used for a frequency converter having a positive and negative DC link voltage which is applied via bridges of switching elements in an alternating sequence to phases of a motor. Pulse width modulation (PWM) signals drive the switching elements for a respective one of the phases and current sensors capture phase currents. In a step a), PWM signals are applied as test patterns to the switching elements. In a step b), sensor signals of the current current sensors are picked up. In a step c), the sensor signals are evaluated by ascertaining a presence of the DC link voltage upon a displacement current being recognized in the sensor signals.

5 Claims, 1 Drawing Sheet

METHOD FOR DIAGNOSING A FREQUENCY CONVERTER

CROSS-REFERENCE TO PRIOR APPLICATION

Priority is claimed to German Patent Application No. DE 10 2014 201 500.6, filed on Jan. 28, 2014, the entire disclosure of which is hereby incorporated by reference herein.

FIELD

The present invention relates to a method for diagnosing faults in a system which uses a frequency converter. In the event of a fault, such a method is used for quickly localizing the fault source.

BACKGROUND

In present day machine tools, electric drives are used for moving various machine tools in a controlled manner. Thus, the axis drives ensure that the individual axes of the machine tool are moved into the required positions. Spindle drives provide for the rotary motion of a tool, such as of a milling tool or drill. To this end, a numerical control converts motions specified in a parts program into nominal position values that are transmitted to a control unit that includes a position controller, speed controller and current regulator. In the current regulator, nominal voltage values for individual motor phases are generated that are converted by a frequency converter using what is generally referred to as pulse width modulation.

A frequency converter draws electrical energy from a multiphase alternating current grid in that a direct voltage is first generated by a rectifier which is used to charge a DC link capacitor to a desired DC link voltage. An inverter connects the phases of a motor via two switching elements to the positive and negative DC link voltage in each case. The switches are appropriately switched in accordance with the pulse width modulation (PWM) pattern, in order to generate the required voltage potential at each phase of a motor that is required for reaching the nominal current values in the motor. The actual motor currents are measured at the output of the frequency converter and are signaled back to the current regulator.

Various methods are known in the related art for testing the proper functioning of a frequency converter and, in the event of a fault, for localizing the fault source.

Thus, the German Examined Accepted Specification DE 10148740 B4 describes a charging circuit for the DC link of a frequency converter that is able to detect a short circuit in the motor. The design of a frequency converter known from the related art including a rectifier, a DC link and an inverter is illustrated here in FIG. 1, for example, together with the power supplying grid and the connected motor.

The European Examined Patent Application EP 1355163 B1 describes a method and a device for testing the proper functioning of a frequency converter. To this end, when the DC link is charged, PWM test patterns are output to the switching elements of the inverter. The voltage occurring at the motor connections is recorded by capacitive sensors and compared to an expected voltage pattern. Even if this method makes do with just one single test line that is capacitively coupled to the motor connections, and with a corresponding voltmeter, there is a certain additional outlay that is to be expended for installing these components, however.

A type of fault that often needs to be examined is the question of whether a motor that is at a standstill, in spite of appropriate control, is to be attributed to the absence of DC link voltage, or whether another fault is present, such as a motor that is not properly connected. Since the DC link voltage in a frequency converter typically resides within a range of several hundred volts, a direct measurement is costly. Safety considerations normally necessitate a galvanic isolation from the downstream evaluation electronics.

SUMMARY

In an embodiment, the present invention provides a method for diagnosing a frequency converter. The frequency converter has a positive and negative DC link voltage which is applied via bridges of switching elements in an alternating sequence to phases of a motor. Pulse width modulation (PWM) signals drive the switching elements for a respective one of the phases and current sensors capture phase currents. In a step a), PWM signals are applied as test patterns to the switching elements. In a step b), sensor signals of the current current sensors are picked up. In a step c), the sensor signals are evaluated by ascertaining a presence of the DC link voltage upon a displacement current being recognized in the sensor signals.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a diagnostic method for the DC link voltage of a frequency converter that functions effectively without any or with only a few additional components.

A method for diagnosing a frequency converter is provided whose positive and negative DC link voltage is applied via bridges of switching elements in alternating sequence to phases of a motor, in that PWM signals drive the switching elements of a phase, current sensors capturing the phase currents. The method includes the steps of:

applying PWM signals as test patterns to the switching elements;

the current sensors picking up the sensor signals;

evaluating the sensor signals by ascertaining the presence of the DC link voltage when a displacement current is recognized in the sensor signals.

A displacement current in the current sensors of the frequency converter may only occur when a DC link voltage is actually present. If these displacement currents, which are supposed to occur in each case at the edges of the PWM signals used as test patterns, are absent, then the absence of the DC link voltage is likely.

By comparing the amplitude of the displacement currents, it is even possible to discern when only individual phases of a motor are connected, and others not. Thus, a connected motor phase leads to a higher displacement current in the frequency converter than at the connections where no motor phase is connected. On the other hand, if a motor phase is absent, then the displacement current at the particular connecting terminal of the frequency converter becomes smaller than in the other connected phases.

Figure 1:
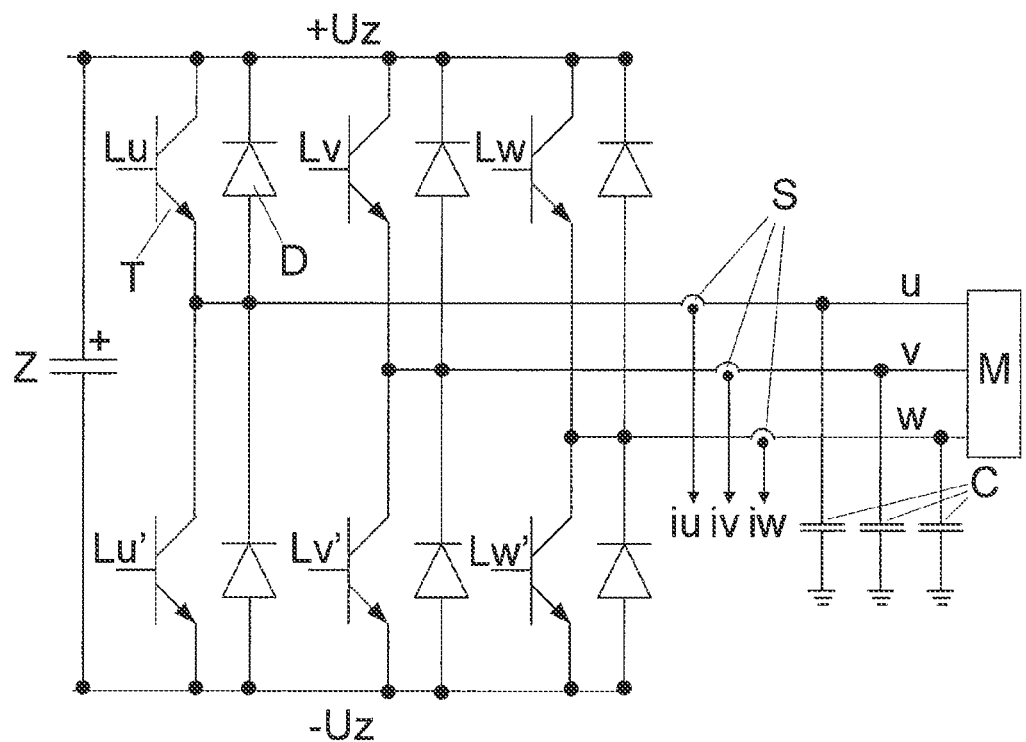
FIG. 1 shows a frequency converter having a connected motor.

FIG. 1 shows DC link Z of a frequency converter to which an inverter is connected. Phases u, v, w of a motor M are connected via two switching elements T each of the inverter both to the positive, as well as to the negative DC link voltage +Uz, −Uz. As is customary, free-wheeling diodes D are connected in parallel to switching elements T. Switching elements T are driven by logic signals Lu, Lv and Lw (respectively, by logic counterpart Lu', Lv', Lw' thereof); the two switching elements T of a phase u, v, w each being inversely driven, while maintaining a brief dead time, so that the two switching elements T of a phase u, v, w are never conductive at the same time.

Moreover, FIG. 1 shows sensors S which are used to measure current iu, iv, iw flowing in each phase u, v, w of the direction motor M, in order to close the current control loop. To this end, only two of three phases are often measured for this purpose, as the current of the third phase should be the sum of the two other phases. Current sensors S are normally configured at the output of the frequency converter, near the connecting terminals of motor M.

If, at this point, a fault occurs due to a motor not moving, although, corresponding PWM signals are present at switching elements T in the frequency converter, then the fault source may be the absence of a DC link voltage +Uz, −Uz. However, it may simply be that the motor is not connected, respectively the motor cable is interrupted.

Testing DC link voltage +Uz, −Uz directly by measurement of the same is costly due to the galvanic isolation required for this purpose. For that reason, as well, it is desirable to have another method for localizing the fault.

Roughly divided into three steps, the method for diagnosing the frequency converter provides that a test pattern be output to switching elements T of the frequency converter (step a); the signals of the current sensors be captured in the process (step b); and be assessed (step c).

Figure 2:
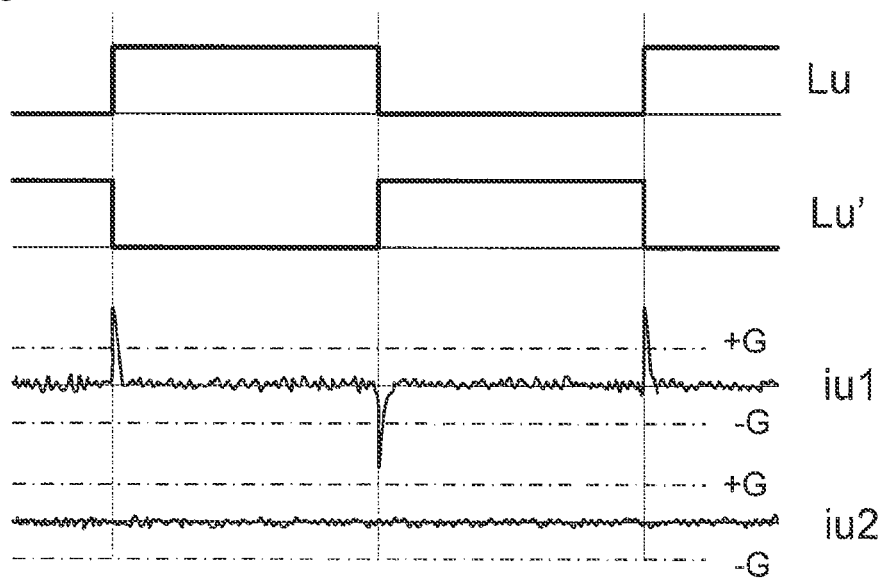
FIG. 2 shows a PWM test pattern and currents that are measured at the frequency converter.

FIG. 2 shows the test pattern and the sensor signals. The representation is limited to a motor phase u, as the other phases are tested in the same manner, when necessary.

Step a):

Inverse PWM signals Lu, respectively Lu' are applied to switching elements T of a motor phase u. This preferably takes place synchronously for all phases u, v, w, since, otherwise, a ripple current would flow between the phases that would hinder the process of evaluating the displacement currents.

Moreover, inverse PWM signals Lu, respectively Lu' should have a pulse duty factor of 50% since a voltage of 0V then arises at the output of the frequency converter. Thus, motor phase u is uniformly switched back and forth between positive and negative DC link voltage +Uz, −Uz.

Step b):

Signals iu, iv, iw of current sensor S are received. If a DC link voltage +Uz, −Uz is present, but motor M is not connected to phase u, for example, then AC voltage present at the output of the frequency converter induces a displacement current that current sensor S receives as sensor signal iu1. This displacement current flows through capacitor C to ground, respectively to DC link Z. Capacitor C may be made up of permanently installed capacitors or simply by stray capacitances that may be selectively supported, for example, by a suitable layout of copper surfaces on the board of the frequency converter.

Current sensor S of motor phase u is utilized for detecting the displacement current. Thus, no additional outlay is required for this purpose.

On the other hand, if no DC link voltage +Uz, −Uz is present, then no displacement current is produced by applying PWM signals Lu, Lu', so that current sensor S merely detects noise in accordance with sensor signal iu2 of FIG. 2.

Step c):

Thus, sensor signal is evaluated to determine whether current spikes occur when the logic level of the PWM signal is switched over, as in the case of signal iu1, or not, as in the case of signal iu2.

As a possible fault source, the absence of a DC link voltage +Uz, −Uz is ruled out in the first case without direct measurement of the same. Thus, improperly connected motor M is ruled out as well, for example.

In the second case, the absence of DC link voltage +Uz, −Uz may be the probable fault source.

Current spikes may be detected by simply monitoring limit values+/−G in response to the exceeding or undershooting thereof, sensor signal iu1 indicating a displacement current. To ensure that the detection process is protected against interference signals in current sensors S, attention may also be paid to the point in time of the exceeding or undershooting of limit values+/−G, since they must be temporally correlated with the switching over of PWM signals Lu, Lu'. A very reliable indication of a displacement current is current spikes coinciding multiple times with the flanks of the PWM signal.

If, in addition, the magnitude of the current spikes is determined in the various phases, for instance, using a plurality of limit values of different amounts, then individual, improperly connected motor phases may also be identified, as described above, since a connected motor phase leads to a higher displacement current than in the case of an open connecting terminal of the frequency converter.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for diagnosing a frequency converter, the frequency converter having a positive and negative DC link voltage which is applied via bridges of switching elements in an alternating sequence to phases of a motor, wherein pulse width modulation (PWM) signals drive the switching elements for a respective one of the phases, and wherein current sensors capture phase currents, the method comprising:
 a) applying PWM signals as test patterns to the switching elements;
 b) picking up sensor signals of the current sensors; and
 c) ascertaining a presence of the DC link voltage upon a displacement current being recognized in the sensor signals at each of the flanks of the PWM signals applied as the test patterns, the displacement current being recognized by detecting discrete current spikes occurring in the sensor signals and determining whether each respective one of the current spikes temporally coincides with each respective one of the flanks of the test patterns.

2. The method as recited in claim 1, wherein, in step a), the test pattern has a pulse duty factor of 50%.

3. The method as recited in claim 1, wherein, in step a), the test pattern is output synchronously for all of the phases.

4. The method as recited in claim 1, wherein the current spikes are detected by comparing the sensor signals to limit values.

5. The method as recited in claim 1, wherein, in step b), the sensor signals are picked up for at least two phases of the motor, the method further comprising:
 comparing an amplitude of the displacement currents in the sensor signals for the at least two phases of the motor so as to ascertain whether the phases are connected to the motor or not; and
 identifying a first one of the at least two phases that is not connected based on a second one of the at least two phases having a higher displacement current than the first one of the at least two phases.

\* \* \* \* \*